(12) United States Patent
Hayashi et al.

(10) Patent No.: US 8,363,496 B2
(45) Date of Patent: Jan. 29, 2013

(54) SEMICONDUCTOR MEMORY DEVICE PERFORMING REFRESH OPERATION AND METHOD OF TESTING THE SAME

(75) Inventors: Tomonori Hayashi, Tokyo (JP); Akihiko Kagami, Tokyo (JP); Yuji Sugiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 205 days.

(21) Appl. No.: 12/805,238

(22) Filed: Jul. 20, 2010

(65) Prior Publication Data

US 2011/0026339 A1 Feb. 3, 2011

(30) Foreign Application Priority Data

Jul. 31, 2009 (JP) .................................. 2009-179936

(51) Int. Cl.
*G11C 29/08* (2006.01)
*G11C 7/00* (2006.01)
(52) U.S. Cl. ......................... 365/201; 365/222; 365/236
(58) Field of Classification Search ........................ None
See application file for complete search history.

(56) References Cited

U.S. PATENT DOCUMENTS 5,625,597 A * 4/1997 Hirose ........................... 365/201
2005/0108460 A1* 5/2005 David ............................. 711/5
2008/0049532 A1* 2/2008 Kajigaya ....................... 365/222

OTHER PUBLICATIONS

Elpida Memory, Inc., "Partial Array Self Refresh (PASR," Technical Note 2005, URL:http://www.elpida.com/pdfs/J0597E10.pdf (Ver.1. 0), Aug. 2005, p. 1-5.

* cited by examiner

*Primary Examiner* — Hoai V Ho
*Assistant Examiner* — James G Norman
(74) *Attorney, Agent, or Firm* — McGinn IP Law Group, PLLC

(57) ABSTRACT

A semiconductor memory device includes a mask information storage circuit that stores therein mask information indicating an area for which the self refresh operation is not performed among a plurality of areas in a memory cell array, a mask determining circuit that is activated by a self refresh command and generates a match signal in response to a detection of a match between a refresh address and the mask information, and a refresh operation control circuit that disables the self refresh operation in response to an activation of the match signal. When a test mode signal is activated, the mask determining circuit is also activated by the auto refresh command. With this configuration, it is possible to perform a test of a partial array self refresh function without actually entering a self refresh mode.

13 Claims, 12 Drawing Sheets

| Command | CKE CK(n-1) | CKE CK(n) | /CS | CA0 | CA1 | CA2 | CA3 | CA4 | CA5 | CA6 | CA7 | CA8 | CA9 | CK EDGE |
|---|---|---|---|---|---|---|---|---|---|---|---|---|---|---|
| MRW | H | H | L | L | L | L | L | MA0 | MA1 | MA2 | MA3 | MA4 | MA5 | ↱ |
|  |  |  |  | MA6 | MA7 | OP0 | OP1 | OP2 | OP3 | OP4 | OP5 | OP6 | OP7 | ↳ |

FIG.3A

| MR# | MA (7:0) | Function | OP7 | OP6 | OP5 | OP4 | OP3 | OP2 | OP1 | OP0 |
|---|---|---|---|---|---|---|---|---|---|---|
| 16 | 10H | LOAD OF BANK MASK INFORMATION | BANK MASK INFORMATION |||||||||
| 17 | 11H | LOAD OF SEGMENT MASK INFORMATION | SEGMENT MASK INFORMATION |||||||||

FIG.3B

| OP | Bank | BA 2:0 |
|---|---|---|
| 0 | 0 | 000B |
| 1 | 1 | 001B |
| 2 | 2 | 010B |
| 3 | 3 | 011B |
| 4 | 4 | 100B |
| 5 | 5 | 101B |
| 6 | 6 | 110B |
| 7 | 7 | 111B |

FIG.4A

| OP | Segment | R12:10 |
|---|---|---|
| 0 | 0 | 000B |
| 1 | 1 | 001B |
| 2 | 2 | 010B |
| 3 | 3 | 011B |
| 4 | 4 | 100B |
| 5 | 5 | 101B |
| 6 | 6 | 110B |
| 7 | 7 | 111B |

FIG.4B

| Bank Mask (MR16) | Segment Mask (MR17) | Bank 0 | Bank 1 | Bank 2 | Bank 3 | Bank 4 | Bank 5 | Bank 6 | Bank 7 |
|---|---|---|---|---|---|---|---|---|---|
| | | 0 | 1 | 0 | 0 | 0 | 0 | 0 | 1 |
| Segment 0 | 0 | | M | | | | | | M |
| Segment 1 | 0 | | M | | | | | | M |
| Segment 2 | 1 | M | M | M | M | M | M | M | M |
| Segment 3 | 0 | | M | | | | | | M |
| Segment 4 | 0 | | M | | | | | | M |
| Segment 5 | 0 | | M | | | | | | M |
| Segment 6 | 0 | | M | | | | | | M |
| Segment 7 | 1 | M | M | M | M | M | M | M | M |

Bank Mask (MR16) = (10000100b)
Segment Mask (MR17) = (10000010b)

FIG.5

SEMICONDUCTOR MEMORY DEVICE PERFORMING REFRESH OPERATION AND METHOD OF TESTING THE SAME

BACKGROUND OF THE INVENTION

1. Field of the Invention

The present invention relates to a semiconductor memory device and a method of testing the semiconductor memory device, and more particularly relates to a semiconductor memory device in which a partial array self refresh operation can be performed and a method of testing the semiconductor memory device.

2. Description of Related Art

As is widely known, a DRAM (Dynamic Random Access Memory), which is a representative semiconductor memory device, requires a periodic refresh operation to maintain data stored therein. The refresh operation includes a few types, such as an auto refresh operation that is performed every time a refresh command is issued from outside and a self refresh operation that is performed by internally generating a refresh signal in a periodic and automatic manner. Among these, the self refresh operation is a refresh operation performed at the time of standby, which requires an operation with low power consumption.

Among DRAMs, in a technical area in which low power consumption is strongly demanded, such as a product for a mobile application, an operation called "partial array self refresh" is supported, in which a self refresh operation is not performed on the whole memory cell array, but is performed only on predetermined areas. When a partial array self refresh operation is performed, because the refresh operation is omitted for areas in which data does not need to be maintained, it is possible to reduce the power consumption at the time of standby (see "Partial Array Self Refresh" Elpida Memory, Inc., Technical Note 2005).

It can be determined whether to perform a refresh operation for each area in a partial array self refresh operation by preparing a predetermined pattern in advance or specifying the area for each bank. An example of preparing a predetermined pattern in advance includes, for example, in a memory composed of banks 0 to 3, a case where three patterns are prepared including a pattern of refreshing the bank 0, a pattern of refreshing the banks 0 and 1, and a pattern of refreshing all the banks 0 to 3. An example of specifying the area for which the refresh operation is performed for each of the banks includes, for example, in a memory composed of banks 0 to 7, a case where the refresh operation can be specified for each of the banks 0 to 7. In this case, the pattern of specifying the area includes 255 ($=2^8-1$) patterns ("1" is subtracted from "$2^8$" because a pattern of specifying no banks is excluded).

It is tested by an operation test before shipment whether the partial array self refresh operation is properly functioning. In actual cases, because it is required to enter a self refresh mode for performing the test of the partial array self refresh operation, a test of one pattern takes a relatively long time (about 1 second). In the former example described above (three patterns), the total test time is about 3 seconds, which is not so problematic. However, in the latter example described above (255 patterns), the total test time becomes about 255 seconds, which means a non-negligible length of time has to be consumed.

Furthermore, in recent years, it is required to divide each of the banks into a plurality of segments and to specify the refresh operation for each of the segments. Assuming a configuration of 8 banks×8 segments, because the pattern includes 255 ($=2^8-1$) patterns for the banks and 255 ($=2^8-1$) patterns for the segments, the total number of patterns becomes 65025 ($=255^2$). As a result, the total test time becomes about 65025 seconds (about 18 hours), which is an unrealistic length of time as a test time in mass production.

As described above, in a conventional semiconductor memory device in which a partial array self refresh operation can be performed, it takes a longer time to test the operation if the area for which the refresh operation is performed is specified in a finely divided manner. The time required to test the operation is not only a problem limited in DRAMs but also a problem occurring in all types of semiconductor memory devices that require a refresh operation to maintain date stored therein.

SUMMARY

In one embodiment, there is provided a semiconductor memory device that performs a self refresh operation based on a self refresh command and an auto refresh operation based on an auto refresh command. The semiconductor memory device includes: a memory cell array that includes a plurality of areas; a mask information storage circuit that stores therein mask information indicating an area for which the self refresh operation is not performed among the areas; a mask determining circuit that is activated by the self refresh command and generates a match signal in response to a detection of a match between a refresh address and the mask information; and a refresh operation control circuit that disables a self refresh operation in response to an activation of the match signal, wherein when a test mode signal is activated, the mask determining circuit is also activated by the auto refresh command.

In another embodiment, there is provided a method of testing the semiconductor memory device that includes: performing data writing in the memory cell array in a repeated manner by issuing the auto refresh command and inputting data with the test mode signal being activated; reading out data from the memory cell array; and evaluating at least the mask information storage circuit and the mask determining circuit by comparing data written in the memory cell array with data read out from the memory cell array.

According to the present invention, because a mask determining circuit is activated by an auto refresh command when a test mode signal is activated, it is possible to perform a test of a partial array self refresh function without actually entering a self refresh mode. Because the auto refresh command can be issued continuously at a short cycle (for example, a cycle of 200 ns), even when the area for which the refresh operation is performed is specified in a finely divided manner, it is possible to test at short times whether the partial array self refresh function is properly functioning.

BRIEF DESCRIPTION OF THE DRAWINGS

The above features and advantages of the present invention will be more apparent from the following description of certain preferred embodiments taken in conjunction with the accompanying drawings, in which:

FIG. 3A is a table for explaining an allocation to the command address signals at the time of performing a setting of the mode register 28, and FIG. 3B is a table for explaining an input method for the setting signals MR16 and MR17;

FIG. 4A is a table for explaining a relationship between the signals OP0 to OP7 and banks to be masked;

FIG. 4B is a table for explaining a relationship between the signals OP0 to OP7 and segments to be masked;

FIG. 5 is a table showing an example of banks and segments to be masked by the mask information MASK;

DETAILED DESCRIPTION OF THE EMBODIMENTS

Preferred embodiments of the present invention will be explained below in detail with reference to the accompanying drawings.

Figure 1:
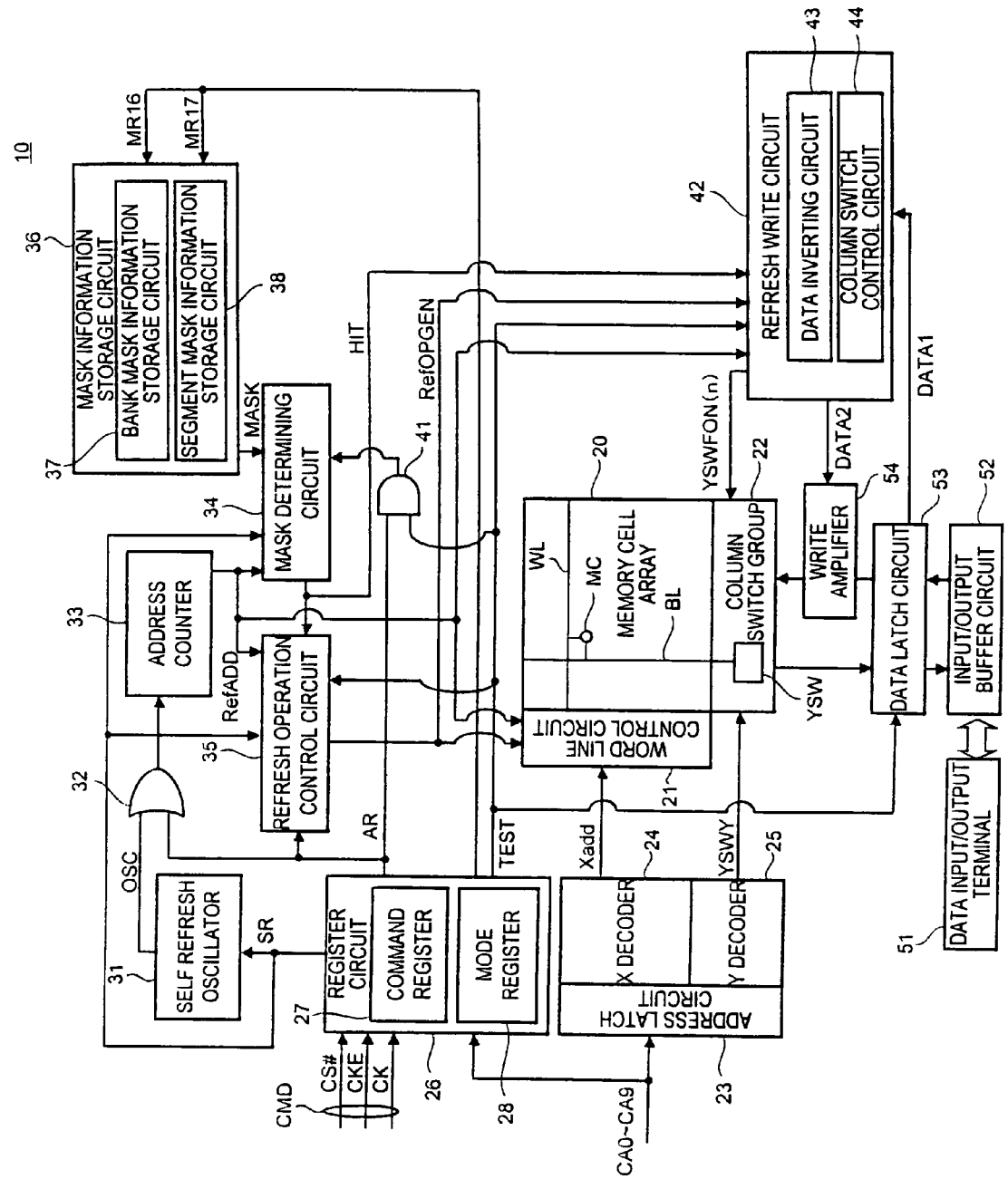
FIG. 1 is a block diagram of a semiconductor memory device 10 according to an embodiment of the present invention.

FIG. 1 is a block diagram of a semiconductor memory device 10 according to an embodiment of the present invention.

As shown in FIG. 1, the semiconductor memory device 10 according to the present embodiment includes a memory cell array 20 that includes a plurality of DRAM memory cells MC. In the memory cell array 20, a plurality of word lines WL and a plurality of bit lines BL are arranged intersecting with each other, and each of the memory cells MC is arranged at every point at the intersections of the word lines WL with the bit lines BL. As described later, the memory cell array 20 is divided into eight banks including banks 0 to 7, and each of the banks is divided into eight segments including segments 0 to 7.

Selection of the word line WL included in the memory cell array 20 is performed by a word line control circuit 21 based on a row selection signal Xadd or a refresh address RefADD. Selection of the bit line BL included in the memory cell array 20 is performed by a column switch group 22 based on a column selection signal YSWY or a forced on signal YSWFON. The column switch group 22 is composed of a plurality of column switches YSW each of which is connected to its corresponding one of the bit lines BL.

The row selection signal Xadd and the column selection signal YSWY are generated based on command address signals CA0 to CA9 that are supplied from an external memory controller. Specifically, the command address signals CA0 to CA9 are latched in an address latch circuit 23, among which, a portion corresponding to a row address is decoded by an X decoder 24 and output as the row selection signal Xadd, and a portion corresponding to a column address is decoded by a Y decoder 25 and output as the column selection signal YSWY.

The command address signals CA0 to CA9 are also supplied to a register circuit 26. The register circuit 26 includes a command register 27 and a mode register 28. The register circuit 26 receives the command address signals CA0 to CA9 and a command signal CMD, and generates various signals based on the received signals. The command signal CMD includes a clock signal CK, a clock enable signal CKE, and a chip selection signal CS.

The signals output from the command register 27 include a self refresh internal command SR and an auto refresh internal command AR. The self refresh internal command SR is output in response to an issuance of a self refresh command, and the auto refresh internal command AR is output in response to an issuance of an auto refresh command. The self refresh internal command SR is supplied to a self refresh oscillator 31. When the self refresh internal command SR is activated, the self refresh oscillator 31 automatically generates an internal refresh signal OSC in a periodic manner. The period of generating the internal refresh signal OSC is set to a period with which information stored in all the memory cells MC included in the memory cell array 20 can be maintained.

The internal refresh signal OSC and the auto refresh internal command AR are supplied to an address counter 33 via an OR gate 32. The address counter 33 is a counter that generates the refresh address RefADD. A counter value of the address counter 33 is updated in response to the internal refresh signal OSC or the auto refresh internal command AR. The refresh address RefADD is supplied to a mask determining circuit 34 and a refresh operation control circuit 35.

The mask determining circuit 34 is activated by the self refresh internal command SR, and activates a match signal HIT to the high level in response to a detection of a match between the refresh address RefADD and mask information MASK. The refresh operation control circuit 35 is activated by the self refresh internal command SR or the auto refresh internal command AR, and when the match signal HIT is not activated, generates a refresh operation signal RefOPGEN. The refresh operation signal RefOPGEN is supplied to the word line control circuit 21, by which a refresh operation for the specified refresh address RefADD is performed. On the other hand, when the match signal HIT is activated, the refresh operation control circuit 35 does not generate the refresh operation signal RefOPGEN, by which the refresh operation is disabled.

The mask information MASK is information that indicates a bank and a segment for which the self refresh operation is not performed among the banks and the segments included in the memory cell array 20, which is supplied from a mask information storage circuit 36. The mask information storage circuit 36 includes a bank mask information storage circuit 37 and a segment mask information storage circuit 38. The bank mask information storage circuit 37 stores therein information indicating a bank for which the self refresh operation is not performed and the segment mask information storage circuit 38 stores therein information indicating a segment for which the self refresh operation is not performed. With this configuration, it is possible to specify whether to perform the self refresh operation for each of the banks and each of the segments.

Figure 2:
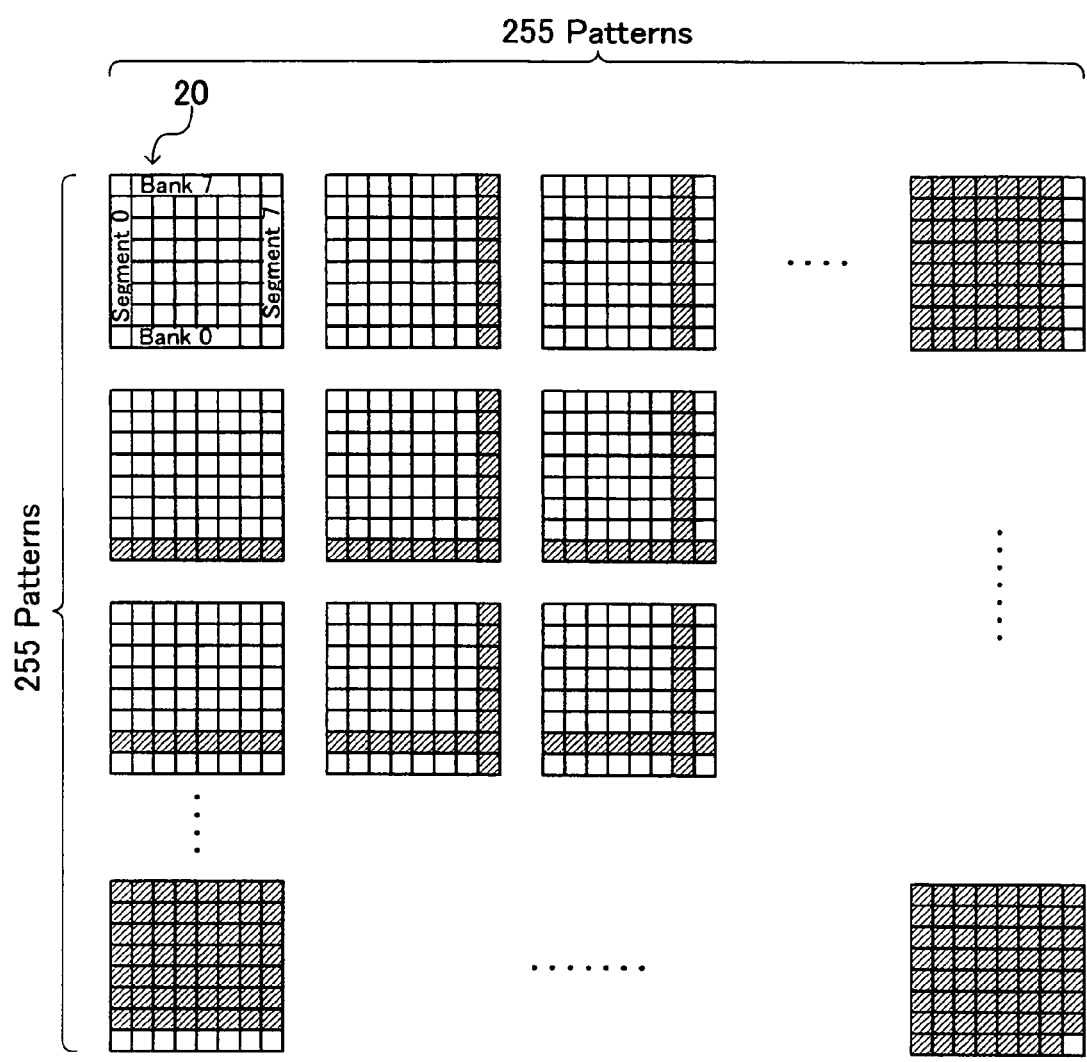
FIG. 2 is a diagram showing a configuration of banks and segments of the memory cell array 20.

FIG. 2 shows a configuration of banks and segments of the memory cell array 20, in which hatched portions indicate banks and segments for which a self refresh operation is not performed and non-hatched portions indicate banks and segments for which a self refresh operation is performed.

As shown in FIG. 2, in the present embodiment, the memory cell array 20 is divided into the eight banks 0 to 7, and each of the banks is divided into the eight segments 0 to 7. It is separately specified by the bank mask information storage circuit 37 whether to perform the self refresh operation for each of the banks 0 to 7, and it is separately specified by the segment mask information storage circuit 38 whether to perform the self refresh operation for each of the segments 0 to 7.

Therefore, the patterns of the partial array self refresh operation include a total of 65025 (=$255^2$) patterns, as there are 255 (=$2^8-1$) patterns for the banks and 255 (=$2^8-1$) patterns for the segments.

The bank mask information storage circuit 37 and the segment mask information storage circuit 38 can store therein the bank and the segment for which the self refresh operation is not performed, in an indirect manner, by storing therein banks and segments for which the self refresh operation is performed.

Settings of the mask information. MASK in the bank mask information storage circuit 37 and the segment mask information storage circuit 38 are respectively performed by setting signals MR16 and MR17 that are supplied from the mode register 28.

FIG. 3A is a table for explaining an allocation to the command address signals at the time of performing a setting of the mode register 28, and FIG. 3B is a table for explaining an input method for the setting signals MR16 and MR17.

As shown in FIG. 3A, at the time of setting the mode register 28 (MRW), each of the command address signals CA0 to CA9 is loaded at a rising edge and a falling edge of a clock signal CK. The command address signals CA4 to CA9 that are loaded at the rising edges and the command address signals CA0 and CA1 that are loaded at the falling edges are respectively used as signals MA0 to MA7, and command address signals CA2 to CA9 that are loaded at the falling edges are respectively used as signals OP0 to OP7. As shown in FIG. 3B, when values of the signals MA0 to MA7 indicate 10H (hexadecimal number), it becomes an input mode for the setting signal MR16, and values of the signals OP0 to OP7 are used as the bank mask information. On the other hand, when the values of the signals MA0 to MA7 indicate 11H (hexadecimal number), it becomes an input mode for the setting signal MR17, and the values of the signals OP0 to OP7 are used as the segment mask information.

FIG. 4A is a table for explaining a relationship between the signals OP0 to OP7 and banks to be masked, and FIG. 4B is a table for explaining a relationship between the signals OP0 to OP7 and segments to be masked.

As shown in FIG. 4A, at the time of setting the bank mask information, the signals OP0 to OP7 are allocated to the banks 0 to 7, respectively. If a logical value of the allocated signal is "0", a bank corresponding to the signal is set to a non-mask state (the self refresh operation is set to enabled), and if the logical value of the allocated signal is "1", the bank is set to a mask state (the self refresh operation is set to disabled). The bank is specified by bank addresses BA2 to BA0. Similarly, as shown in FIG. 4B, at the time of setting the segment mask information, the signals OP0 to OP7 are allocated to the segments 0 to 7, respectively. If a logical value of the allocated signal is "0", a segment corresponding to the signal is set to a non-mask state, and if the logical value of the allocated signal is "1", the segment is set to a mask state. The segment is specified by high bits R12 to R10 of a row address.

FIG. 5 is a table showing an example of banks and segments to be masked by the mask information MASK, in which portions filled in with "M" are the banks and the segments to be masked.

In the example shown in FIG. 5, a setting value of the bank mask information is 10000010b (binary number), and a setting value of the segment mask information is 10000100b (binary number). In this case, the banks 1 and 7 and the segments 2 and 7 are masked. As described above, because the self refresh operation is not performed on masked areas, if the self refresh mode is activated, data stored in the masked areas will be lost.

Referring back to FIG. 1, upon entering a predetermined test mode, the mode register 28 activates a test mode signal TEST. The test mode signal TEST is input to an AND gate 41 together with the auto refresh internal command AR, and an output of the AND gate 41 is supplied to the mask determining circuit 34. When the output of the AND gate 41 is activated to the high level, the mask determining circuit 34 is activated. This means that, even if the self refresh internal command SR is not activated, it is possible to activate the mask determining circuit 34 with the test mode signal TEST and the auto refresh internal command AR.

The test mode signal TEST is also supplied to the refresh operation control circuit 35. When the test mode signal TEST is activated, the refresh operation control circuit 35 invalidates the match signal HIT that is an output of the mask determining circuit 34. That is, when the test mode signal TEST is activated, even if the match signal HIT is activated, the refresh operation control circuit 35 generates the refresh operation signal RefOPGEN, by which the refresh operation is enabled.

With the above configuration, at the time of the self refresh operation, it is possible to perform the partial array self refresh operation based on the mask information MASK that is set in the mask information storage circuit 36, and by activating the test mode signal TEST, it is also possible to validate an operation of the mask determining circuit 34 by the auto refresh command. The operation of the mask determining circuit 34 is validated by the auto refresh command to shorten a test time for the partial array self refresh operation, which is described below.

As shown in FIG. 1, the semiconductor memory device 10 according to the present embodiment further includes an input/output buffer circuit 52, a data latch circuit 53, and a write amplifier 54. The input/output buffer circuit 52 buffers data that is input and output via a data input/output terminal 51. The data latch circuit 53 latches data that is input and output via the input/output buffer circuit 52. The write amplifier 54 amplifies write data that is latched in the data latch circuit 53. With this configuration, at the time of a read operation, any one of the column switches YSW specified by the column selection signal YSWY is switched on, by which read data that is read out from the bit line BL selected by the column selection signal YSWY is output to the data input/output terminal 51 via the data latch circuit 53 and the input/output buffer circuit 52. At the time of a normal write operation, write data input to the data input/output terminal 51 goes through the input/output buffer circuit 52, the data latch circuit 53, and the write amplifier 54, and is supplied to the selected bit line BL via any one of the column switches YSW specified by the column selection signal YSWY.

The above described write operation is an operation performed at the time of a normal operation. However, when the test mode signal TEST is activated to the high level, a different operation is performed by a refresh write circuit 42. The refresh write circuit 42 includes a data inverting circuit 43 and a column switch control circuit 44, by which, when the test mode signal TEST is activated, an operation of inverting the write data and a forced on operation of the column switch YSW are performed.

Figure 6:
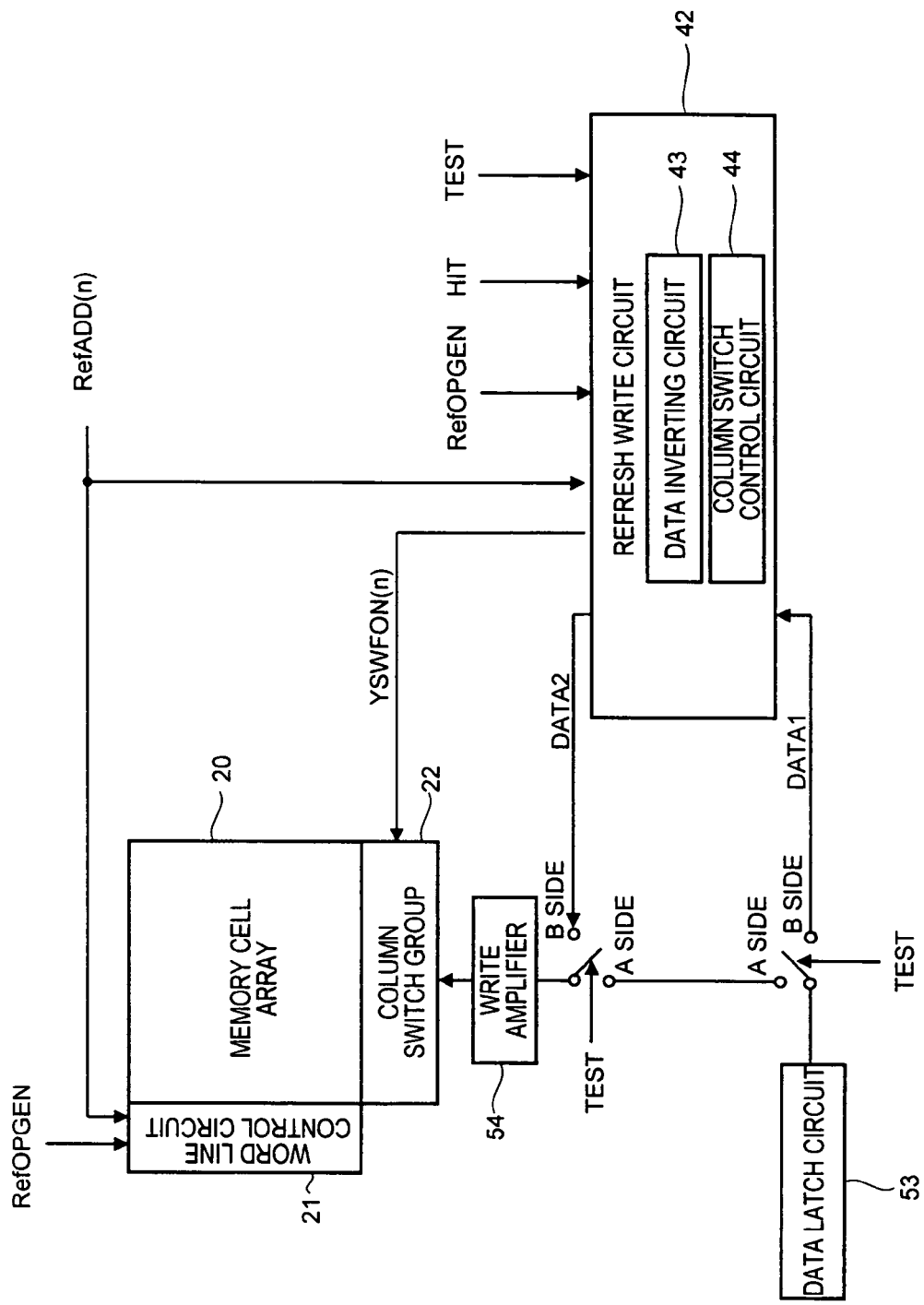
FIG. 6 is a schematic diagram for explaining a function of the refresh write circuit 42.

FIG. 6 is a schematic diagram for explaining a function of the refresh write circuit 42.

As shown in FIG. 6, when the test mode signal TEST is not activated, the data latch circuit 53 and the write amplifier 54 are directly connected to each other because an A side is selected. Furthermore, because the forced on signal YSW-FON is not activated, the normal write operation is performed.

On the other hand, when the test mode signal TEST is activated, the data latch circuit 53 and the write amplifier 54 are not directly connected to each other because a B side is selected, and the write data is supplied via the refresh write circuit 42. That is, write data DATA1 output from the data latch circuit 53 is converted into write data DATA2 by the refresh write circuit 42, and the write data DATA2 is supplied to the write amplifier 54. Furthermore, when the test mode signal TEST is activated, the forced on signal YSWFON is activated, by which all of a plurality of corresponding column switches YSW are forcibly switched on. The plurality of corresponding column switches YSW are a plurality of column switches YSW corresponding to the refresh address RefADD. This means that not all the column switches YSW included in the column switch group 22 are forcibly switched on, but a plurality of column switches YSW corresponding to all the bit lines BL to be connected to the memory cells MC by an activation of the word line WL that is selected based on the refresh address RefADD are forcibly switched on. In FIG. 6, (n) is attached at the end of the refresh address RefADD and the forced on signal YSWFON because of the above reason, where n is an integer from 0 to N. Therefore, the forced on signal YSWFON exists for each refresh address RefADD.

Figure 7:
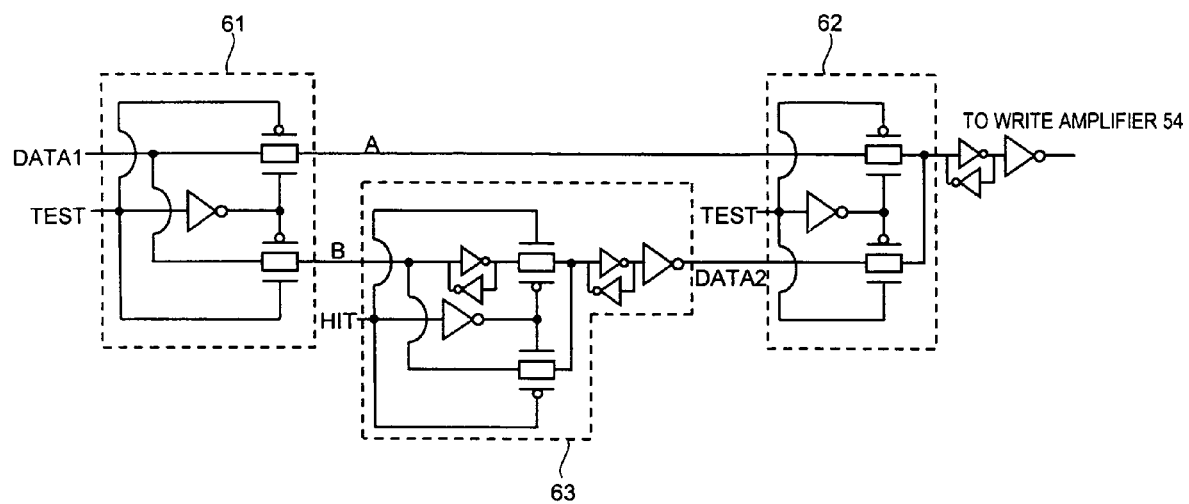
FIG. 7 is a circuit diagram of the data inverting circuit 43 included in the refresh write circuit 42.

FIG. 7 is a circuit diagram of the data inverting circuit 43 included in the refresh write circuit 42. The data inverting circuit 43 shown in FIG. 7 is prepared for each I/O.

As shown in FIG. 7, the data inverting circuit 43 includes switching circuit units 61 and 62 and an inverting circuit unit 63. The switching circuit units 61 and 62 are controlled by the test mode signal TEST. When the test mode signal TEST is not activated (low level), a path A that is a normal path is selected, and when the test mode signal TEST is activated (high level), a path B that is a test path is selected. With this configuration, when the test mode signal TEST is not activated, the write data DATA1 output from the data latch circuit 53 is supplied to the write amplifier 54 as it is. On the other hand, when the test mode signal TEST is activated, the write data DATA1 output from the data latch circuit 53 is inverted into the write data DATA2 by the inverting circuit unit 63, and then the write data DATA2 is supplied to the write amplifier 54.

The inverting circuit unit 63 is controlled by the match signal HIT. When the match signal HIT is not activated (low level), the inverting circuit unit 63 outputs a logical level of the write data DATA1 as the write data DATA2 without performing a conversion. On the other hand, when the test mode signal TEST is activated (high level), the inverting circuit unit 63 inverts the write data DATA1 output from the data latch circuit 53, and outputs data obtained by inverting the write data DATA1 as the write data DATA2.

With the above configuration, the data inverting circuit 43 inverts the write data only when both the test mode signal TEST and the match signal HIT are activated (high level), and otherwise, bypasses the write data without inverting it.

Figure 8:
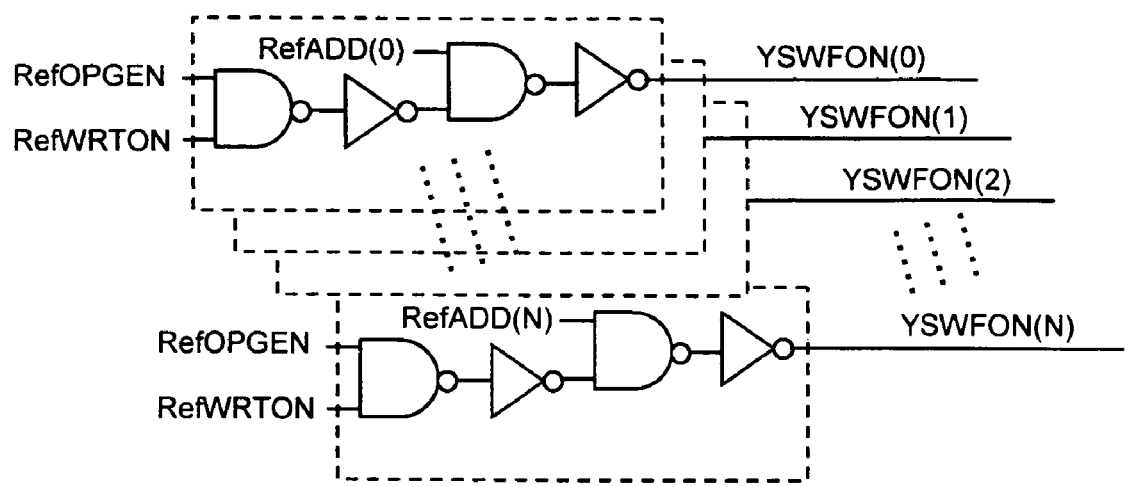
FIG. 8 is a circuit diagram of the column switch control circuit 44 included in the refresh write circuit 42.

FIG. 8 is a circuit diagram of the column switch control circuit 44 included in the refresh write circuit 42. The column switch control circuit 44 shown in FIG. 8 is prepared for each I/O.

As shown in FIG. 8, the column switch control circuit 44 includes (N+1) forced on signal generating circuit units 44-0 to 44-N. Each of the forced on signal generating circuit units 44-*n* (n=0 to N) activates the forced on signal YSWFON (n) to the high level when all the test mode signal TEST, the refresh operation signal RefOPGEN, and the corresponding refresh address RefADD(n) are activated to the high level. Therefore, when the test mode signal TEST is activated, any one of the forced on signals YSWFON (n) is activated every time a count value of the address counter 33 is updated. When the test mode signal TEST is not activated, the forced on signal YSWFON(n) is not activated.

Figure 9:
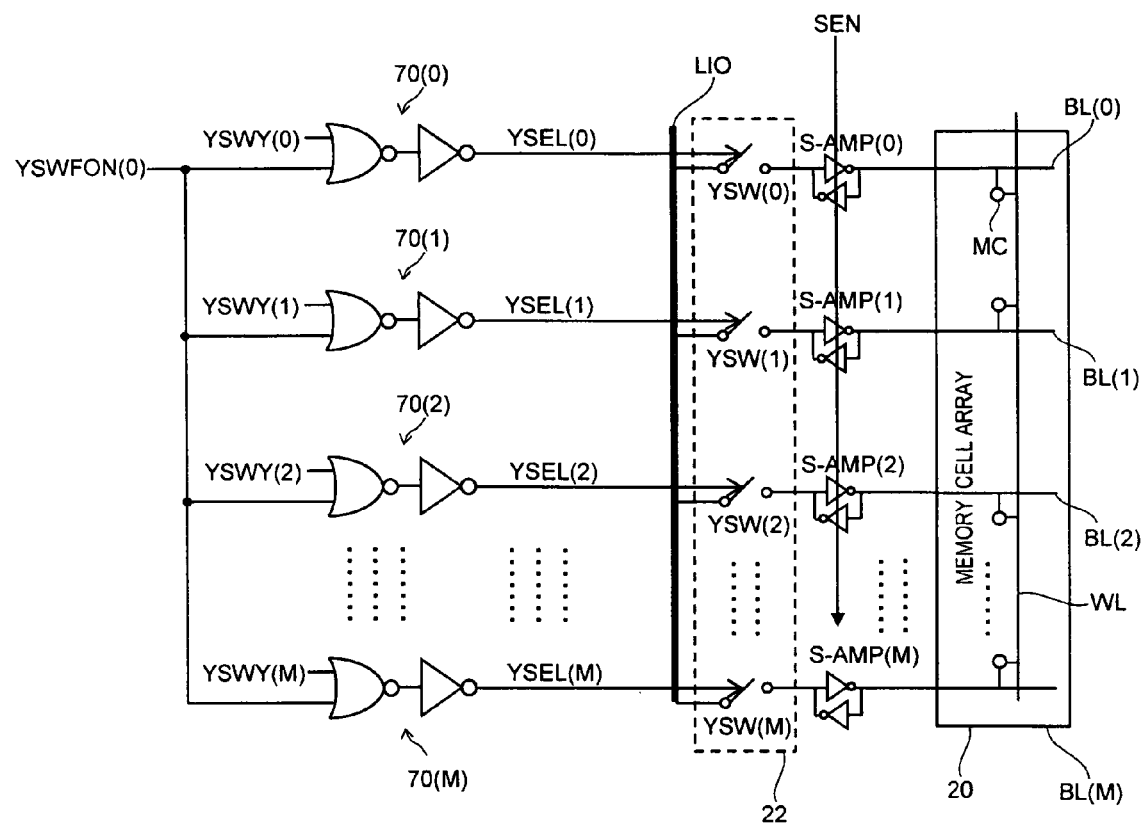
FIG. 9 is a circuit diagram for explaining a function of the forced on signal YSWFON.

FIG. 9 is a circuit diagram for explaining a function of the forced on signal YSWFON. Although a circuit portion pertaining to a forced on signal YSWFON(0) is only shown in FIG. 9, the other circuit portions pertaining to forced on signals YSWFON(1) to YSWFON(n) have the same circuit configuration.

In the example shown in FIG. 9, (M+1) bit lines BL and (M+1) sense amplifiers S-AMP corresponding to the bit lines are arranged, in which each of the sense amplifiers S-AMP is connected to a local I/O line LIO by a corresponding one of the column switches YSW. The sense amplifiers S-AMP are activated by a sense amplifier activating signal SEN. A column selection signal YSEL for controlling the column switch YSW is output from a corresponding OR gate 70. A corresponding one of the column selection signals YSWY(0) to YSWY(M) is supplied to one input terminal of each of (M+1) OR gates, and the forced on signal YSWFON(0) is commonly supplied to the other input terminals. Any one of the column selection signals YSWY(0) to YSWY(M) is activated based on a column address. Therefore, at the time of the normal operation, only any one of (M+1) column switches YSW is switched on, while the rest of the column switches are all kept in an off state.

On the other hand, when the test mode signal TEST is activated, the (M+1) column switches YSW are all switched on, by which the (M+1) bit lines BL are all connected to the same local I/O line LIO. As a result, the same data is written in all memory cells MC that are selected by an activation of the word line WL.

The configuration of the semiconductor memory device 10 is as described above. An operation of the semiconductor memory device 10 according to the present embodiment is explained next.

Figure 10:
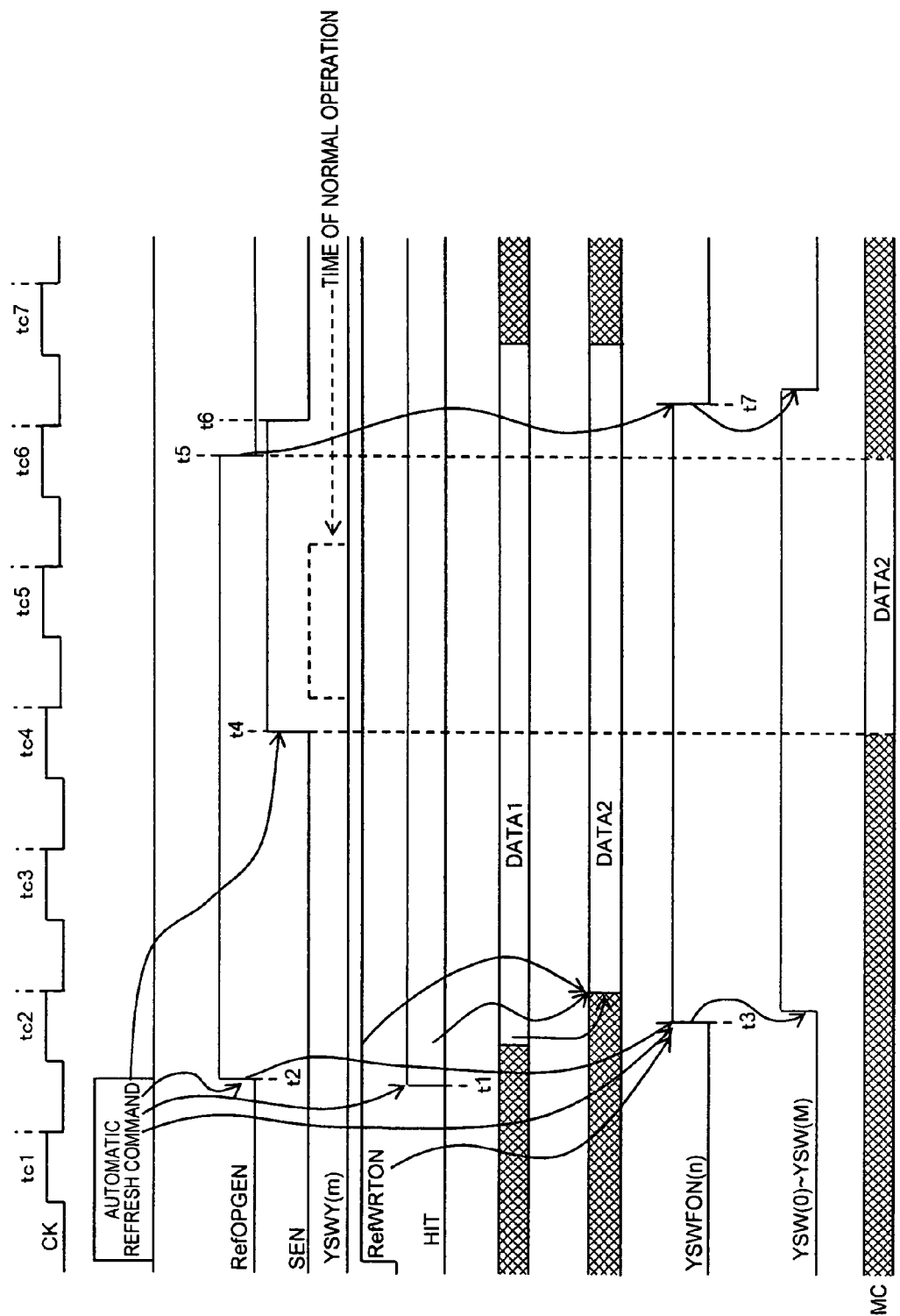
FIG. 10 is a timing chart for explaining an operation of the semiconductor memory device 10 according to the present embodiment at the time of a test mode.

FIG. 10 is a timing chart for explaining an operation of the semiconductor memory device 10 according to the present embodiment at the time of a test mode. The test mode indicates a state in which the test mode signal TEST is activated.

Upon issuing an auto refresh command when the test mode signal TEST is activated, at a time t1, an operation of determining the logical level of the match signal HIT is performed by the mask determining circuit 34. Subsequently, at a time t2, the refresh operation signal RefOPGEN is activated, by which the word line WL corresponding to the refresh address RefADD is selected, and the corresponding memory cell MC is connected to the bit line BL. As explained earlier, at the time of the normal operation, the activation of the refresh operation signal RefOPGEN is disabled if the match signal HIT is activated to the high level. However, when the test mode signal TEST is activated, even if the match signal HIT is activated to the high level, the activation of the refresh operation signal RefOPGEN is still enabled, so that the refresh operation is enabled.

When the refresh operation signal RefOPGEN is activated, a time t3, the forced on signal YSWFON(n) corresponding to the refresh address RefADD(n) is activated. With this operation, all the column switches YSW corresponding to the refresh address RefADD(n) are switched on.

During this time, the write data DATA1 having a predetermined pattern is input from the data input/output terminal 51, and is converted into the write data DATA2 by the data inverting circuit 43. As described above, the logical level of the write data DATA2 is opposite to the logical level of the write data DATA1 when the match signal HIT is activated. Thereafter, at times t4 to t6, the sense amplifier activating signal SEN is activated, by which the write data DATA2 is written in all the memory cells MC that are selected based on the refresh address RefADD.

The refresh operation signal RefOPGEN is deactivated at a time t5, by which writing of the write data DATA2 in the memory cell MC is completed. When the refresh operation signal RefOPGEN is deactivated, at a time t7, the forced on signal YSWFON(n) is deactivated, by which a series of writing operation is completed.

In FIG. 10, a waveform of the column selection signal YSWY at the time of the normal write operation is shown in a broken line. In the test mode, because the column address is not input, the column selection signal YSWY is not activated.

Because the refresh address RefADD is automatically updated every time the auto refresh command is issued, by performing the operation shown in FIG. 10 in a repeated manner, it is possible to write desired data in all the memory cells. Because the inverted data is written when the refresh address RefADD matches the mask information MASK stored in the mask information storage circuit 36, the write data is written as it is in a non-masked area, and the inverted write data is written in a masked area.

Therefore, by sequentially reading out the written data after writing the data in all the memory cells MC, it is possible to verify whether the partial array self refresh function is properly working. Because the auto refresh command can be issued continuously at a short cycle (for example, a cycle of 200 ns), even when the total number of patterns for the partial array self refresh operation is 65025, as is the case in the present embodiment, if the total number of the refresh addresses RefADD is 8192, the time required for the test is 107 seconds ($\cong$200 ns×8192×65025), making it possible to considerably shorten the test time compared to the conventional case.

Figure 11:
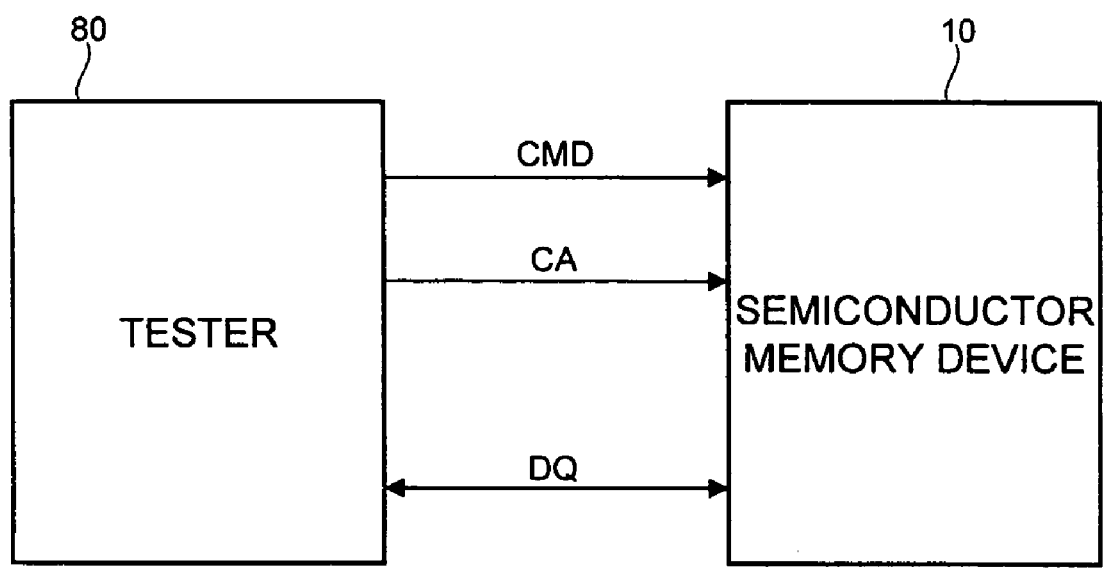
FIG. 11 is a block diagram showing a connection relationship between the semiconductor memory device 10 according to the present embodiment and a tester 80 for testing the semiconductor memory device 10.

FIG. 11 is a block diagram showing a connection relationship between the semiconductor memory device 10 according to the present embodiment and a tester 80 for testing the semiconductor memory device 10. As shown in FIG. 11, the tester 80 supplies the command signal CMD and the command address signal CA to the semiconductor memory device 10 and performs exchange of the write data and the read data DQ with the semiconductor memory device 10. Therefore, it suffices that the tester 80 has the same function as a typical memory controller.

Figure 12:
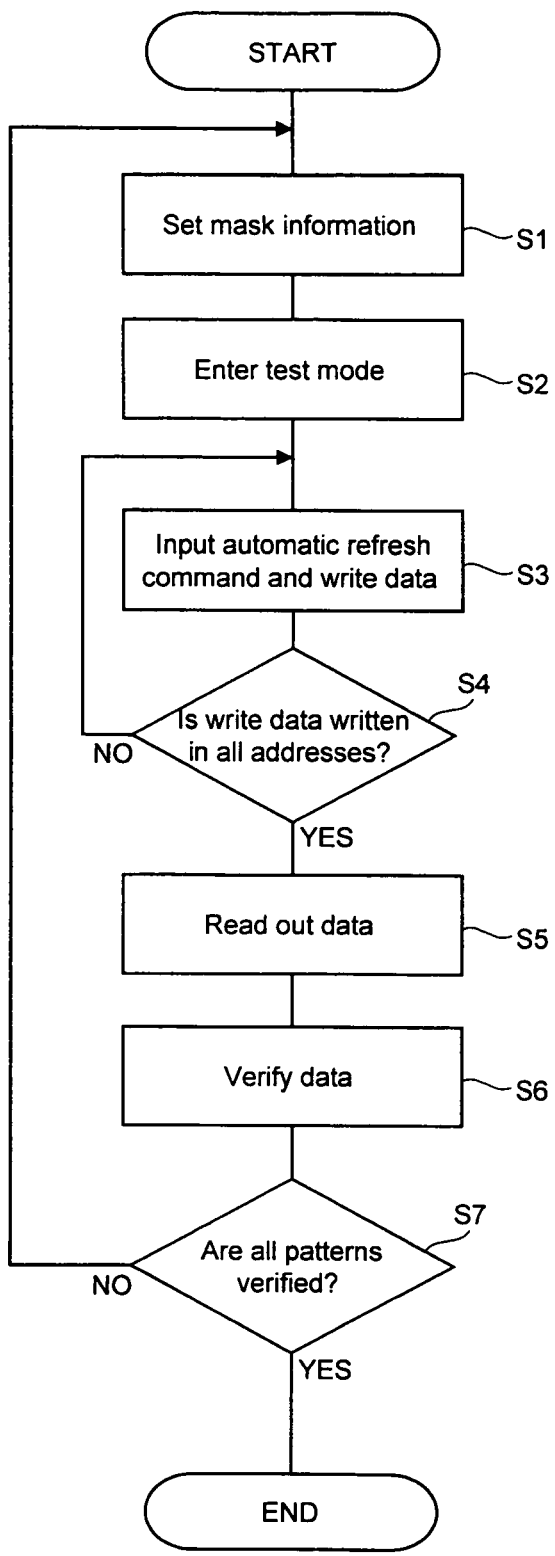
FIG. 12 is a flowchart showing a method of testing the semiconductor memory device 10 with the tester 80.

FIG. 12 is a flowchart showing a method of testing the semiconductor memory device 10 with the tester 80.

Upon the tester 80 issuing the command signal CMD and the command address signal CA, a setting of the mask information MASK is performed (Step S1). As described above, the setting of the mask information MASK is performed with the setting signals MR16 and MR17. Subsequently, with the tester 80 issuing the command signal CMD and the command address signal CA, the semiconductor memory device 10 enters the test mode (Step S2). In this state, the tester 80 issues the auto refresh command and supplies the write data having predetermined pattern (Step S3). With this operation, as described above, the write data with the predetermined pattern is written in a non-masked area, and the write data in which the predetermined pattern is inverted is written in a masked area.

After performing the above operations for all the refresh addresses RefADD (8192 addresses in the present embodiment) (Step S4: YES), all the write data that is written is read out (Step S5). It is verified whether the read data read out from the non-masked area matches the predetermined pattern and the read data readout from the masked area matches the inverted pattern of the predetermined pattern (Step S6). As a result of the verification, if all the read data match their corresponding patterns, it is possible to confirm that the partial array self refresh function is properly working.

By performing the above operations for all the patterns of the partial array self refresh operation (65025 patterns in the present embodiment) (Step S7: YES), a series of test is finished, and the test of the partial array self refresh function is completed. The test of the partial array self refresh function means specifically a test of the mask information storage circuit 36 and the mask determining circuit 34.

It is apparent that the present invention is not limited to the above embodiments, but may be modified and changed without departing from the scope and spirit of the invention.

For example, while the above embodiment has explained an exemplary case that the present invention is applied to a DRAM, the application target of the present invention is not limited thereto, and the invention can be applied to all types of semiconductor memory devices that require a refresh operation to maintain data stored therein.

Furthermore, when the partial array self refresh function is verified, an auto refresh command or write data can also be internally generated in an automatic manner. In addition, an evaluation of Step S6 shown in FIG. 12 can also be performed inside the semiconductor memory device.

What is claimed is:

1. A semiconductor memory device that performs a self refresh operation based on a self refresh command and an auto refresh operation based on an auto refresh command, the semiconductor memory device comprising:
   a memory cell array that includes a plurality of areas;
   a mask information storage circuit that stores therein mask information indicating an area for which the self refresh operation is not performed among the areas;
   a mask determining circuit that is activated by the self refresh command and generates a match signal in response to a detection of a match between a refresh address and the mask information; and
   a refresh operation control circuit that disables a self refresh operation in response to an activation of the match signal,
   wherein the mask determining circuit is also activated by the auto refresh command when a test mode signal is activated.

2. The semiconductor memory device as claimed in claim 1, wherein the refresh operation control circuit enables an auto refresh operation regardless of activation of the match signal when the test mode signal is activated.

3. The semiconductor memory device as claimed in claim 1, further comprising a refresh write circuit that is activated in response to the test mode signal,
   wherein the refresh write circuit changes write data to be written in the memory cell array in response to the match signal.

4. The semiconductor memory device as claimed in claim 3, further comprising:
   a word line control circuit that selects a word line included in the memory cell array based on a row selection signal or the refresh address; and
   a column switch group that selects a bit line included in the memory cell array based on a column selection signal,
   wherein when the test mode signal is activated, the refresh write circuit activates column switches corresponding to all bit lines to be connected to memory cells by an activation of a word line that is selected based on the refresh address, regardless of the column selection signal.

5. The semiconductor memory device as claimed in claim 1, further comprising a mode register that generates the test mode signal upon entering a test mode.

6. The semiconductor memory device as claimed in claim 1, further comprising:
   a self refresh oscillator that automatically generates an internal refresh signal in a periodic manner in response to the self refresh command; and
   an address counter that generates the refresh address, wherein
   the address counter updates a refresh address to be generated in response to the auto refresh command or the internal refresh signal.

7. The semiconductor memory device as claimed in claim 1, wherein
   the memory cell array is divided into a plurality of banks, and
   the mask information stored in the mask information storage circuit includes information for specifying a bank for which the self refresh operation is not performed.

8. The semiconductor memory device as claimed in claim 7, wherein
   each of the banks is divided into a plurality of segments, and
   the mask information stored in the mask information storage circuit includes information for specifying a segment for which the self refresh operation is not performed.

9. A method of testing a semiconductor memory device, the method comprising:
   providing the semiconductor memory device that performs a self refresh operation based on a self refresh command and an auto refresh operation based on an auto refresh command, the semiconductor memory device comprising:
      a memory cell array that includes a plurality of areas;
      a mask information storage circuit that stores therein mask information indicating an area for which the self refresh operation is not performed among the areas;
      a mask determining circuit that is activated by the self refresh command and generates a match signal in response to a detection of a match between a refresh address and the mask information;
      a refresh operation control circuit that disables a self refresh operation in response to an activation of the match signal; and
      a refresh write circuit that is activated in response to a test mode signal,
   wherein the mask determining circuit is also activated by the auto refresh command when the test mode signal is activated, and the refresh write circuit changes write data to be written in the memory cell array in response to the match signal;
   performing data writing in the memory cell array by issuing the auto refresh command and inputting data with the test mode signal being activated;
   reading out data from the memory cell array; and
   evaluating at least the mask information storage circuit and the mask determining circuit by comparing data written in the memory cell array with data read out from the memory cell array.

10. The semiconductor memory device as claimed in claim 1, wherein the mask determining circuit is activated by the auto refresh command when the test mode signal is activated such that a test of a partial array self refresh function is performed without entering a self refresh mode.

11. The semiconductor memory device as claimed in claim 1, wherein the mask determining circuit is activated by the auto refresh command when the test mode is activated without entering a self refresh mode.

12. The method as claimed in claim 9, wherein the mask determining circuit is activated by the auto refresh command when the test mode signal is activated such that a test of a partial array self refresh function is performed without entering a self refresh mode.

13. A method of testing a semiconductor memory device, the method comprising:
   providing the semiconductor memory device that performs a self refresh operation based on a self refresh command and an auto refresh operation based on an auto refresh command, the semiconductor memory device comprising a memory cell array that includes a plurality of areas;
   storing, by a mask information storage circuit, mask information indicating an area for which the self refresh operation is not performed among the areas;
   activating, by a mask determining circuit, by the self refresh command and generating, by the mask determining circuit, a match signal in response to a detection of a match between a refresh address and the mask information;
   disabling, by a refresh operation control circuit, a self refresh operation in response to an activation of the match signal;
   activating, by a refresh write circuit, in response to a test mode signal,
   wherein the mask determining circuit is also activated by the auto refresh command when the test mode signal is activated, and the refresh write circuit changes write data to be written in the memory cell array in response to the match signal;
   performing data writing in the memory cell array by issuing the auto refresh command and inputting data with the test mode signal being activated;
   reading out data from the memory cell array; and
   evaluating at least the mask information storage circuit and the mask determining circuit by comparing data written in the memory cell array with data read out from the memory cell array when the test mode signal is activated and when the test mode signal is not activated.

* * * * *